(12) United States Patent
Barletta

(10) Patent No.: US 9,972,496 B2
(45) Date of Patent: May 15, 2018

(54) PROCESS FOR MANUFACTURING A POWER DEVICE WITH A TRENCH-GATE STRUCTURE AND CORRESPONDING DEVICE

(75) Inventor: Giacomo Barletta, Grottaglie (IT)

(73) Assignee: STMICROELECTRONICS S.R.L., Agrate Brianza (IT)

(*) Notice: Subject to any disclaimer, the term of this patent is extended or adjusted under 35 U.S.C. 154(b) by 1022 days.

(21) Appl. No.: 12/724,342

(22) Filed: Mar. 15, 2010

(65) Prior Publication Data
US 2010/0230747 A1 Sep. 16, 2010

(30) Foreign Application Priority Data

Mar. 13, 2009 (IT) .............................. MI2009A0390

(51) Int. Cl.
| | | |
|---|---|---|
| *H01L 29/76* | (2006.01) | |
| *H01L 21/28* | (2006.01) | |
| *H01L 29/423* | (2006.01) | |
| *H01L 29/66* | (2006.01) | |
| *H01L 29/417* | (2006.01) | |
| *H01L 29/78* | (2006.01) | |

(52) U.S. Cl.
CPC .. *H01L 21/28158* (2013.01); *H01L 21/28008* (2013.01); *H01L 29/42368* (2013.01); *H01L 29/66734* (2013.01); *H01L 29/7813* (2013.01); *H01L 29/41766* (2013.01); *H01L 29/7811* (2013.01)

(58) Field of Classification Search
CPC ............. H01L 29/4916; H01L 29/4925; H01L 21/28008; H01L 29/42368
USPC ........................................ 257/330, 328, 329
See application file for complete search history.

(56) References Cited

U.S. PATENT DOCUMENTS

| | | | |
|---|---|---|---|
| 4,914,058 A * | 4/1990 | Blanchard | ..................... 438/270 |
| 5,082,795 A | 1/1992 | Temple | |
| 5,886,515 A * | 3/1999 | Kelly | ............................ 323/313 |
| 6,190,970 B1 | 2/2001 | Liao et al. | |
| 6,359,309 B1 | 3/2002 | Lao et al. | |
| 6,444,528 B1 | 9/2002 | Murphy | |
| 6,528,355 B2 | 3/2003 | Hirler et al. | |
| 6,580,123 B2 | 6/2003 | Thapar | |
| 6,627,961 B1 | 9/2003 | Francis et al. | |

(Continued)

FOREIGN PATENT DOCUMENTS

EP  1248300  10/2002

OTHER PUBLICATIONS

Italian Search Report based on Italian Application No. ITMI20090390, Ministero dello Sviluppo Economico, Munich, Oct. 14, 2009.

(Continued)

*Primary Examiner* — Samuel Gebremariam
(74) *Attorney, Agent, or Firm* — Seed IP Law Group LLP

(57) ABSTRACT

An embodiment for realizing a power device with trench-gate structure integrated on a semiconductor substrate, and including etching the semiconductor substrate to make a first trench having first side walls and a first bottom; and further etching said semiconductor substrate to make a second trench inside the first trench, realized in a self-aligned way and below this first trench, the first trench and the second trench defining the trench-gate structure with a bird beak-like transition profile suitable for containing a gate region.

30 Claims, 16 Drawing Sheets

(56) References Cited

U.S. PATENT DOCUMENTS

| | | | |
|---|---|---|---|
| 7,005,351 | B2 | 2/2006 | Henninger et al. |
| 7,045,858 | B2 | 5/2006 | Matsuda et al. |
| 7,205,607 | B2 | 4/2007 | Alessandria et al. |
| 7,397,082 | B2 * | 7/2008 | Takemori et al. ............ 257/329 |
| 7,671,410 | B2 | 3/2010 | Zhao et al. |
| 7,709,889 | B2 * | 5/2010 | Moens et al. ................ 257/330 |
| 7,842,574 | B2 | 11/2010 | Arena et al. |
| 8,368,139 | B2 * | 2/2013 | Ananthan ..................... 257/330 |
| 8,637,369 | B2 | 1/2014 | Magri et al. |
| 8,664,713 | B2 | 3/2014 | Magri et al. |
| 8,741,709 | B2 | 6/2014 | Seok et al. |
| 2003/0235958 | A1 | 12/2003 | Chan et al. |
| 2005/0169050 | A1 | 8/2005 | Itoh et al. |
| 2007/0063272 | A1 | 3/2007 | Arena et al. |
| 2007/0290260 | A1 * | 12/2007 | Adan ............... H01L 29/66734 257/330 |
| 2009/0014785 | A1 * | 1/2009 | Moens ............. H01L 29/66734 257/330 |
| 2009/0020798 | A1 * | 1/2009 | Lee et al. ...................... 257/303 |
| 2009/0127609 | A1 | 5/2009 | Han et al. |
| 2009/0127617 | A1 * | 5/2009 | Shin et al. .................... 257/330 |
| 2010/0230747 | A1 | 9/2010 | Barletta |
| 2013/0037852 | A1 | 2/2013 | Tamaki |
| 2014/0138739 | A1 | 5/2014 | Magri' et al. |
| 2014/0273357 | A1 | 9/2014 | Seok et al. |

OTHER PUBLICATIONS

Honghua Du, Richard E. Tressler, Karl E. Spear, and Carlo G. Pantano, "Oxidation Studies of Crystalline CVD Silicon Nitride", J. Electrochem Soc., vol. 136, No. 5, May 1989, pp. 1527-1536.

R. Koba and R. E. Tressler, "Thermal Nitridation of SiO2 Thin Films on Si at 1150 C", Solid-State Science and Technology, Journal of the Electrochemical Society, Jan. 1988, vol. 135, No. 1, pp. 144-150.

Krishan L. Luthra, "A Mixed Interface Reaction/Diffusion Control Model for Oxidation of Si3N4", J. Electrochem Soc., vol. 138, No. 10, Oct. 1991, pp. 3001-3007.

Sam Zhang, Nasar Ali, "Nanocomposite Thin Films and Coatings: Processing, properties and Performance", Imperial College Press, London, 2007, pp. 97-100.

Dinesh C. Gupta and George A. Brown, "Gate Dielectric Integrity: Material, Process, and Tool Qualification", American Society for Testing and Materials, Jan. 2000, pp. 123-124.

P. Goarin, G. E. J. Koops, R. Van Dalen, C. Le Cam, and J. Saby: "Split-gate Resurf Stepped Oxide (RSO) MOSFETs for 25V applications with record low gate-to-drain charge", Proceedings of the 19th International Symposium on Power Semiconductor Devices & ICs, IEEE, 2007, pp. 61-64.

Aoki et al., "High Performance and Reliability Trench Gate Power MOSFET With Partially Thick Gate Oxide Film Structure (PT0x-TMOS)," Proceedings of the 18th International Symposium on Power Semiconductor Devices IC's, Naples, Italy, Jun. 4-8, 2006, 4 pages.

* cited by examiner

US 9,972,496 B2

PROCESS FOR MANUFACTURING A POWER DEVICE WITH A TRENCH-GATE STRUCTURE AND CORRESPONDING DEVICE

PRIORITY CLAIM

The present application claims priority to Italian Patent Application No. MI2009A000390, filed Mar. 13, 2009, which application is incorporated herein by reference in its entirety.

TECHNICAL FIELD

An embodiment of the present disclosure relates to a method for realizing a power device with trench-gate structure on a semiconductor substrate.

An embodiment of the disclosure also relates to a power device with trench-gate structure integrated on a semiconductor substrate.

BACKGROUND

IGBT power devices and MOS devices find wide and specific application in fields with high voltage and current such as for example in the field of the control circuits and of power switches.

These power devices are generally expected to provide good performances at high switch speeds. The characteristic, fundamental parameters for reducing the switch times in these devices are a low gate charge Qg, and thus a lower gate capacity, and a reduced and uniform gate resistance Rg.

The market is also driving a continuous miniaturization of these power devices.

The power devices, IGBT and MOS, integrated on a semiconductor substrate, comprise a plurality of elemental cells, each having its own gate region, interposed between source and body regions.

The elemental cells are substantially realized in two versions: one with planar gate and the other with trench-gate structure.

In a method for realizing a power device with trench-gate structure, and in particular with a trench of the Metal Insulator Semiconductor (MIS) type, for each elemental cell the gate is realized by means of the formation of a trench, on the semiconductor substrate, whose side walls and whose bottom are covered by an oxide layer, the trench being subsequently filled with a polysilicon layer.

These power devices with trench-gate structure of the MIS type have several advantages in particular they allow an increase in the integration scale with subsequent increase of the current density, as well as an abatement of the JFET resistance, with a substantial improvement of the characteristic in conduction of the device.

However, the power devices with trench-gate structure of the MIS type have some drawbacks. In fact, due to the curved profile of the basal region of the trench, in this region there is a thickening of the electric field, which may overcome the limit of the oxide (e.g., 10 MV/cm) and compromise the insulation between the semiconductor substrate and the upper polysilicon layer. There is a solution to this drawback, which makes the bottom of the trench by suitably sizing the curvature radius of the basal region with a "U"-like profile to reduce or minimize the effects of the thickening of the electric field.

These devices with trench-gate structure have another drawback with respect to the devices with planar gate. In fact, for each elemental cell of these devices, the gate oxide occupies a greater area and this implies an increase of the parasite capacities linked to the gate terminal of the device as a whole.

A known solution realizes the gate electrode in correspondence with the vertical walls of the trench-gate structure, for example as described in FIG. 1 of U.S. Pat. No. 7,205,607, which is incorporated by reference.

Another known solution provides a thickening of the gate oxide in the bottom of the trench and in the walls below the body region, for example as described in FIG. 2 of U.S. Patent application 2007/0063272 which is incorporated by reference.

A similar solution is also described in FIG. 3 of U.S. Pat. No. 7,005,351 which is incorporated by reference, relative to a method for manufacturing a transistor configuration comprising at least one trench transistor cell. Also this solution provides a thick oxide in the bottom of the trench and a thin gate oxide only in the side walls of the trench.

A similar solution is described in FIG. 4 of U.S. Pat. No. 6,528,355, which is incorporate by reference.

According to these solutions, the thick oxide layers, present in correspondence with the bottom of the trench-gate structure, are obtained by means of particular process steps, which employ suitable additional layers overlapped onto the thick oxide layer. The additional layers, of materials such as resist or nitride, are subsequently subjected to etching processes to be removed. These etching processes may, however, compromise the "strength" of the thick oxide and thus the performances of the device obtained, and, in the meantime, increase the number of process steps and the realization times.

Alternatively, these thick oxide layers may be often obtained by means of a selective oxidation step in correspondence with the bottom of the trench. However, this step may crystallographically damage the semiconductor substrate below the bottom of the trench-gate structure, which consequently may reduce the performance of the device thus obtained.

SUMMARY

An embodiment is a method for realizing a power device having such structural and functional characteristics as to improve its performance, overcoming the limits and the drawbacks still affecting the devices realized according to the prior art.

An embodiment is a trench-gate structure with a limited bottom, which allows obtaining a thick oxide without employing overlapped layers.

An embodiment is a method for realizing a power device with trench-gate structure integrated on a semiconductor substrate and comprising at least one of:

etching said semiconductor substrate by means of a hard mask to make a first trench having first side walls and a first bottom;

further etching said semiconductor substrate to make a second trench inside said first trench, realized in a self-aligned way and below said first trench, said first trench and said second trench defining said trench-gate structure with a bird beak-like transition profile suitable for containing a gate region.

According to an embodiment, this etching step is a plasma anisotropic dry etching.

An embodiment of the method further comprises coating said first side walls and said first bottom of said first trench with a service insulating layer and of forming service spacers in correspondence with said first coated side walls as well as of making said second trench self-aligned to said service spacers.

According to an embodiment, this provides the realization of said service insulating layer by means of oxidation of said semiconductor substrate left exposed by said hard mask, in particular with the realization, through thermal growth, of a silicon dioxide or insulating oxide layer, with thickness approximately 5 to 100 nm.

Further, this may comprise the formation of a limiter oxide layer above said hard mask.

According to another embodiment, the method may also make, above said semiconductor substrate, a service layer of non-oxidizable material. In particular, said service non-oxidizable layer may cover said service insulating layer and have a portion that covers said hard mask. Even more in particular, said service non-oxidizable layer may be realized through a deposition, according to a CVD process (Chemical Vapor Deposition), of a layer chosen among: nitride, oxinitride, oxide-nitride or ONO i.e., oxide-nitride-oxide, according to the application.

According to another embodiment a method comprises:

forming said service spacer through removal of said service non-oxidizable layer; and removing said service insulating layer left exposed by said service spacer in correspondence with the bottom of said first trench and removing said limiter oxide layer above said hard mask.

According to a further embodiment, said second trench may be obtained with a process self-aligned to the pre-existing geometries, in particular to said service spacers.

According to an embodiment a method forms a first insulating coating layer, in correspondence with second side walls and with a bottom of said second trench.

According to another embodiment a method provides that said first insulating coating layer is formed by means of a localized oxidation process (LOCOS), said oxidation being inhibited by said service spacers along said first side walls of said first trench and by said hard mask on the surface of said substrate.

According to another embodiment, the growth of said first coating layer, which is in particular a thick oxide layer, occurs in the cavity corresponding to said second trench, but also in correspondence with the side walls of said substrate, and in particular of a portion thereof underlying said service spacers. In particular, said growth step occurs by means of oxidation.

Further, it may be possible to balance a final thickness of said first coating layer in such a way that it is self-aligned to the one of said first trench.

According to a further embodiment, during the oxidation step in the lower end of each service spacer, in correspondence with the remaining portions of said first bottom of said first trench, the oxidation of the silicon vertical wall left exposed in the cavity of said second trench by said service non-oxidizable layer, which composes said service spacers, forms a typical bird beak-like shape.

According to another embodiment a method provides a step of cleaning said first side walls of said first trench and the upper surface of said substrate, with removal of said hard mask too. In particular, said cleaning step is carried out by means of a sequence of sacrificial oxidations followed by isotropic etchings.

According to another embodiment a method removes said service spacers and said service insulating layer and realizes a second insulating coating layer in correspondence with said first side walls of said first trench, said second insulating coating layer being continuous to said first insulating coating layer and having a reduced thickness with respect to a thickness of said first insulating coating layer.

According to another embodiment, the method may comprise:

realizing a third insulating coating layer on said semiconductor substrate; and depositing a conductive layer on said semiconductor substrate as well as defining said conductive layer for the realization of said gate region.

Said third insulating coating layer may be realized simultaneously with said second insulating coating layer and with the same material.

Furthermore, according to an embodiment the definition of said conductive layer is such as to maintain the same only inside each trench-gate structure.

Moreover, an embodiment may further comprise realizing metallic contacts, by means of a passivation and a metallization. According to an embodiment gate contacts are made by means of an appendix suitable for contacting said conductive layer inside each trench-gate structure.

According to an embodiment the method defines said conductive layer by means of suitable and predetermined masks so as to comprise an extension overhanging at least one portion of an edge circuit structure. In this case, then, gate contacts may be realized above a ring.

According to an embodiment, said second insulating coating layer, realized in the first side walls of said first trench, defines a gate dielectric for the driving of said power device, while said first insulating coating layer, in correspondence with said second trench, defines an insulating thick oxide layer between said gate region and said underlying semiconductor substrate.

Moreover, according to a further embodiment, a method provides to realize the service spacers by comprising a step of making a service layer of non-oxidizable material above the semiconductor substrate, this service non-oxidizable layer comprising, above the hard mask, a limiter oxide layer interposed between said hard mask and a portion above said service layer.

An embodiment may be a power device with trench-gate structure integrated on a semiconductor substrate, comprising a first trench made in said semiconductor substrate and having first side walls;

a second trench, having second side walls and a bottom, extended below said first trench in said semiconductor substrate, said second trench being contained in said first trench and self-aligned thereto, said first trench and said second trench defining said trench-gate structure with a bird beak-like transition profile, suitable for containing a gate region.

According to an embodiment, said second side walls and said bottom of said second trench are coated with a first insulating coating layer.

According to an embodiment, a device comprises a second insulating coating layer in correspondence with said first side walls of said first trench, said second insulating coating layer being continuous to said first insulating coating layer and having a reduced thickness with respect to a thickness of said first insulating coating layer.

According to an embodiment, said second insulating coating layer and said first insulating coating layer define said bird beak-like transition.

According to an embodiment, a device comprises a further insulating coating layer above the semiconductor substrate and a conductive layer contained in said trench-gate structure to realize said gate region. In particular, said conductive layer is, for example, doped polysilicon.

According to an embodiment, the power device further comprises metallic contacts, such as for example the gate and source ones. In particular, the gate contacts may be realized with an appendix suitable for contacting said inner conductive layer to each trench-gate structure.

According to a further embodiment, said conductive layer has an extension which overhangs at least one portion of an edge circuit structure and which is suitably contacted by said gate contacts, which are thus realized above a ring.

BRIEF DESCRIPTION OF THE DRAWINGS

One or more embodiments will be apparent from the following description, which is given by way of indicative and non limiting example with reference to the annexed drawings.

DETAILED DESCRIPTION

With reference to the figures, an embodiment of a power device 1 is described with a trench-gate structure 10, of the MIS type, integrated in a semiconductor substrate 2.

Hereafter a series of the steps of a method according to an embodiment, which lead to the formation of a power device of the above type, is described in detail.

The steps of the method and the structures described hereafter may not form a complete process flow for the manufacture of a power device. In fact, an embodiment may be put into practice together with the manufacturing techniques of the integrated devices currently used in the field and only those commonly used process steps that are believed helpful for comprehension are hereafter described.

The figures that show cross sections of a semiconductor device during the manufacture may not be drawn to scale, but may be instead drawn so as to show important characteristics of an embodiment.

Figure 21:
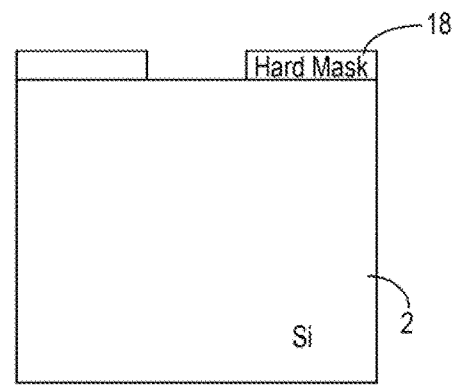
Figure 22:
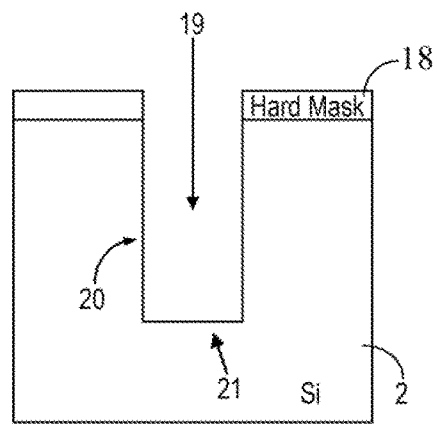

An embodiment for realizing a power device 1 with a trench-gate structure 10, described in particular with reference to the perspective views of FIGS. 6 to 18 as well as to the section views of FIGS. 20 to 33, comprises the following steps:

realization of an edge circuit structure 50 of a power device/starting from a semiconductor substrate 2 by means of realization of a field oxide and successive implantation in its peripheral region with formation of a ring 48, alignment of a hard mask 18 by means of etching of the semiconductor substrate 2 to make a plurality of first trenches 19, each having first side walls 20 and a first bottom 21, as shown in section for each single first trench in the FIGS. 21 and 22.

The method may also comprise, prior to this alignment, a conventional realization of a body layer 3, and of a source region 4 above the body layer 3.

An embodiment may provide a conventional step of cleaning the side walls 20 of the first trench 19, by means of a sequence of sacrificial odixations followed by isotropic etchings.

Figure 7:
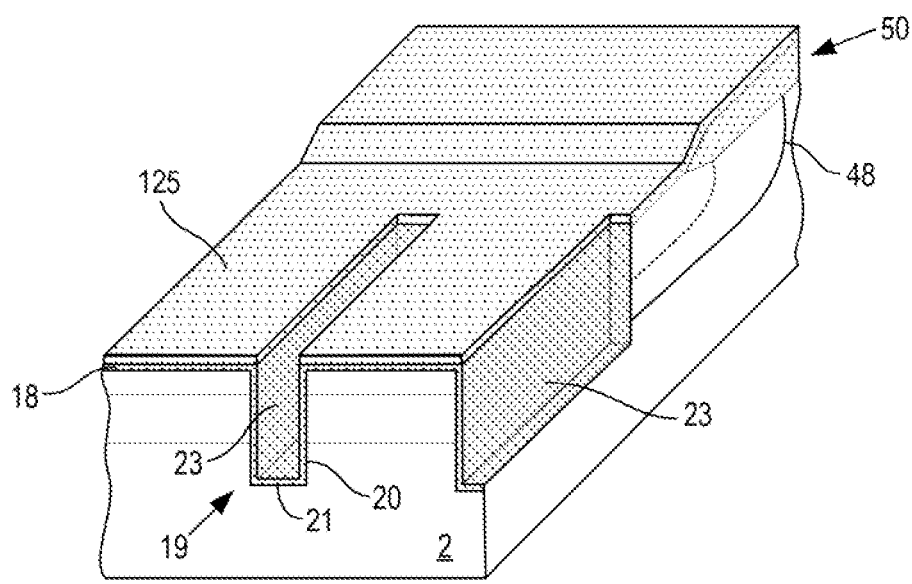
Figure 23:
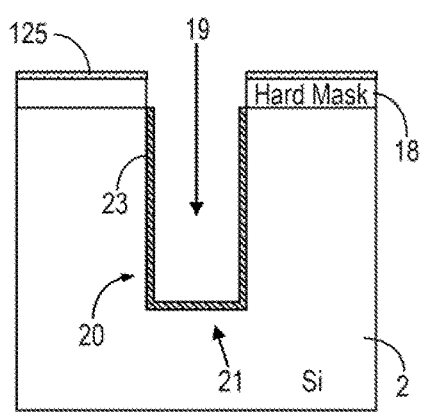

According to an embodiment, the method then provides, as shown in FIGS. 7 and 23, the following steps:

coating the first side walls 20 and the first bottom 21, of each first trench 19, by means of a service insulating layer 23.

According to an embodiment, this step provides the realization of the service insulating layer 23 by means of oxidation of the semiconductor substrate 2 left exposed by the hard mask 18, in particular with the realization by means of thermal growth of a silicon dioxide or insulating oxide layer, with thickness of approximately 5 to 100 nm. Moreover, this step comprises the formation of a limiter oxide layer 125 above the hard mask 18.

Figure 20:
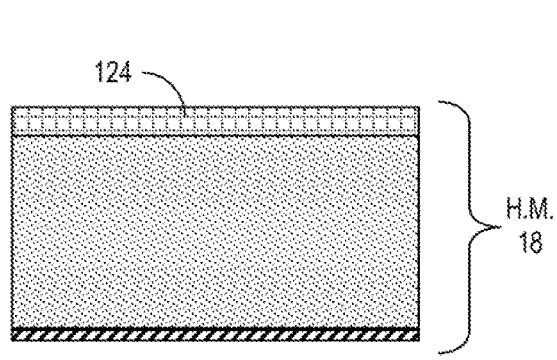
FIGS. 20 to 33 show, in a vertical section view only and with greater details, some steps of a method according to an embodiment shown in FIGS. 6-18.

The hard mask 18 may comprise a multilayer, and, in particular, at least one non-oxidizing layer overhung, for example, by a non-oxidizable layer 124, such as a nitride layer, as shown for example in FIG. 20, whose function will be clarified hereafter in the description.

Figure 8:
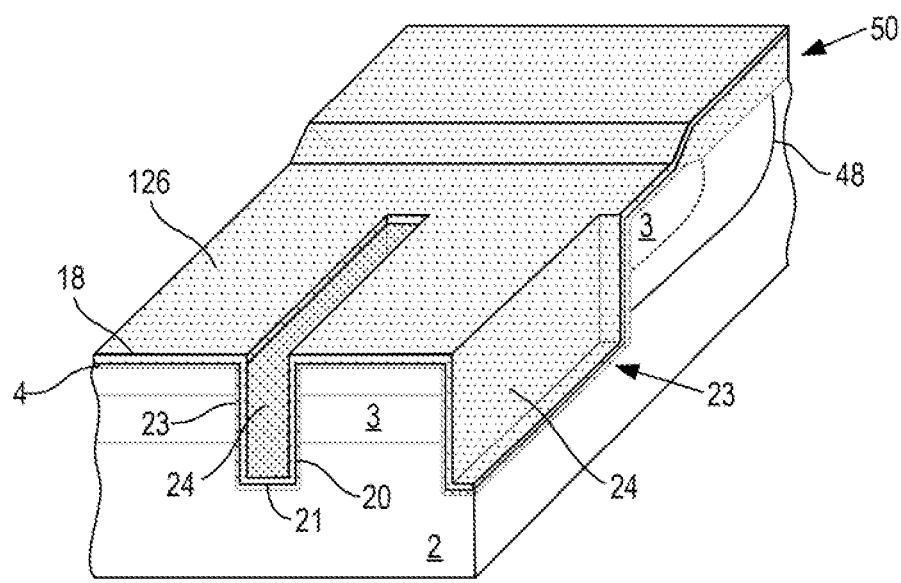
Figure 24:
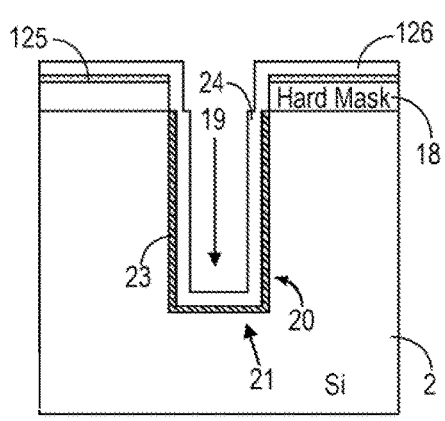

According to an embodiment, as highlighted in FIGS. 8 and 24, a method subsequently provides the step of:

making, above the semiconductor substrate 2, a service layer 24 of non-oxidizable material. In particular, the non-oxidizable service layer 24 covers the service insulating layer 23 and has a portion 126 which covers the hard mask 18. Even more in particular, the service non-oxidizable layer 24 may be realized by means of a deposition, by means of a CVD process (Chemical Vapor Deposition), of a layer chosen among: nitride, oxinitride, oxide-nitride or ONO i.e., oxide-nitride-oxide, according to the application. The service non-oxidizable layer 24 deposited may have a total thickness of about 10-150 nm.

Figure 9:
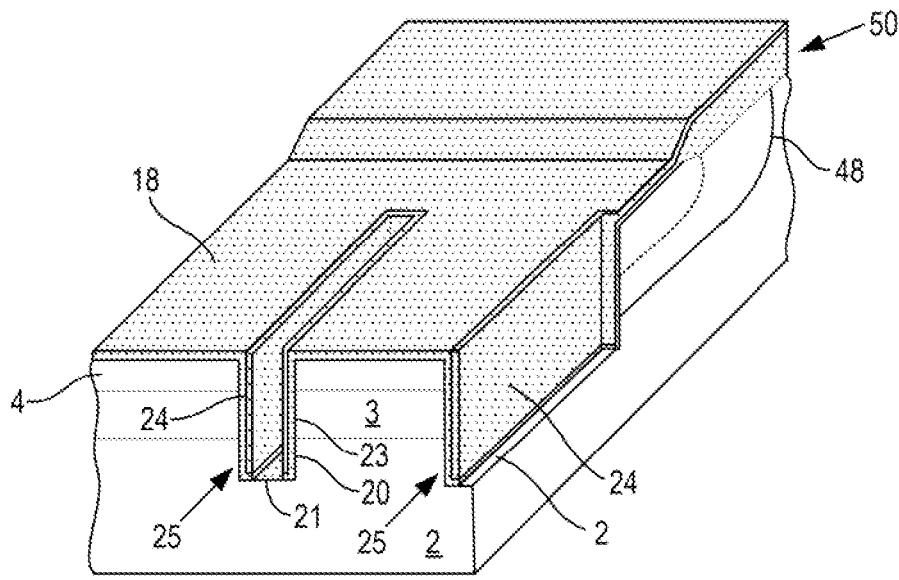
Figure 25:
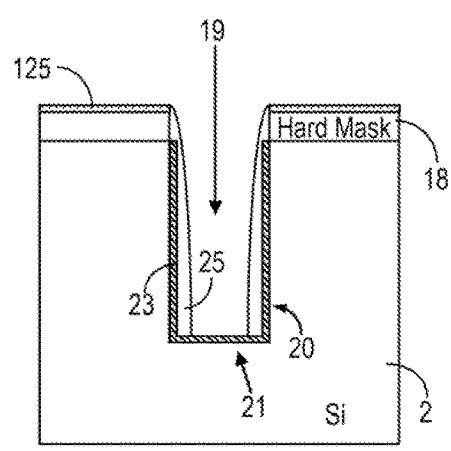
Figure 26:
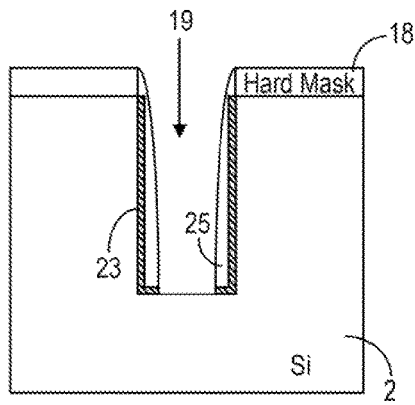

An embodiment of a method further provides, as highlighted in FIGS. 9, 25 and 26, the step of:

etching the first bottom 21 of each first trench 19 for respectively removing the service non-oxidizable layer 24 and the service insulating layer 23 so as to expose the underlying semiconductor substrate 2. The etching step may be of the plasma anisotropic dry etching.

According to an embodiment, the etching step also defines service spacers 25 in correspondence with the first side walls 20. Suitably, moreover, after the etching step, the non oxidizing layer in the hard mask 18 is brought back to the surface above the semiconductor substrate 2, as shown in FIG. 26.

More in particular, an embodiment comprises:

forming the service spacer 25 by means of removal of the service non-oxidizable layer 24, as shown in FIG. 25; and removing the service insulating layer 23, left exposed by the service spacer 25 in correspondence with the bottom 21 of the first trench 19, and of the limiter oxide layer 125 above the hard mask 18, as shown in FIG. 26.

Figure 10:
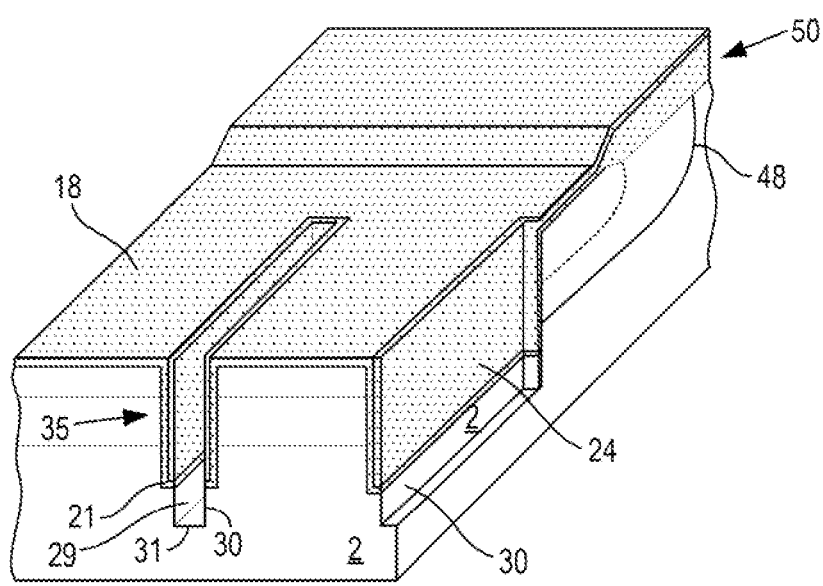
Figure 27:
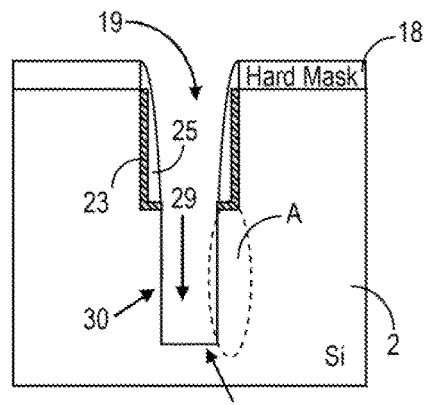

According to an embodiment, as highlighted in FIGS. 10 and 27, the method provides:

etching the semiconductor substrate 2 and realizing below the first bottom 21 of each first trench 19 a second trench 29 which comprises second side walls 30 and a bottom 31.

According to an embodiment, the second trench 29 is obtained with a process self-aligned to the pre-existing geometries, in particular then the second trench 29 is self-aligned to the service spacers 25. Suitably, in this way, the method does not need additional photolithographic steps.

Figure 1:
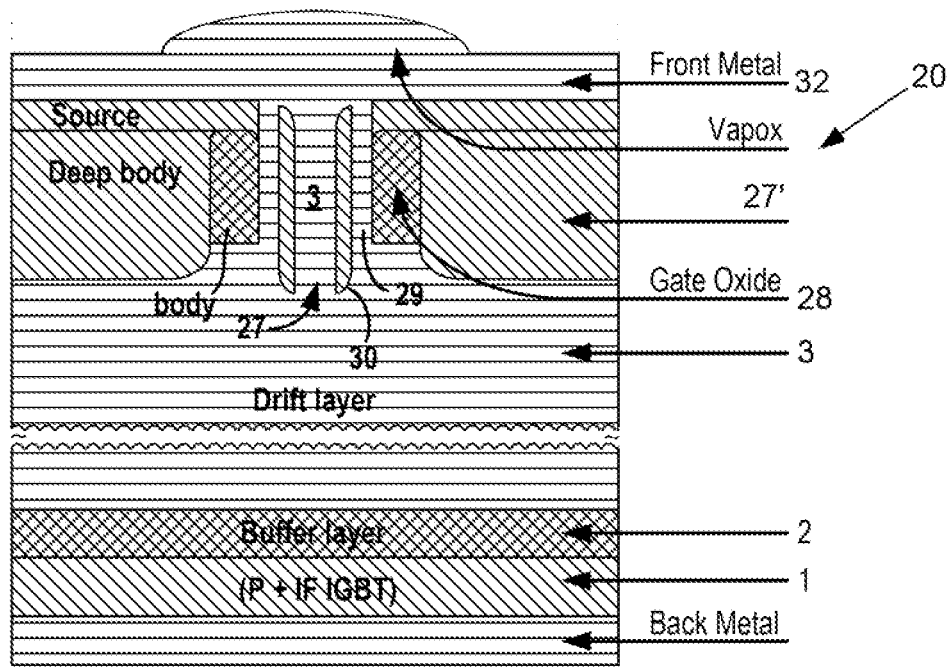
FIGS. 1 to 4 show power devices with a trench-gate structure, realized according to the prior art.
Figure 2:
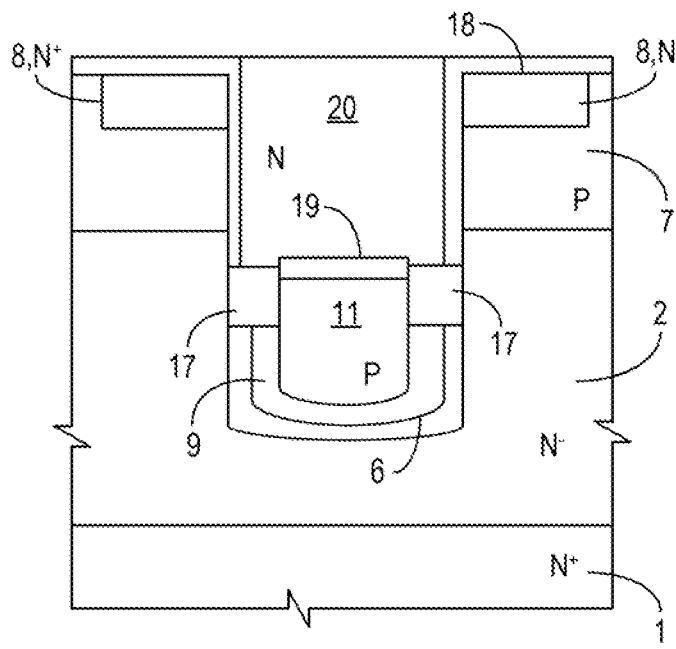
Figure 3:
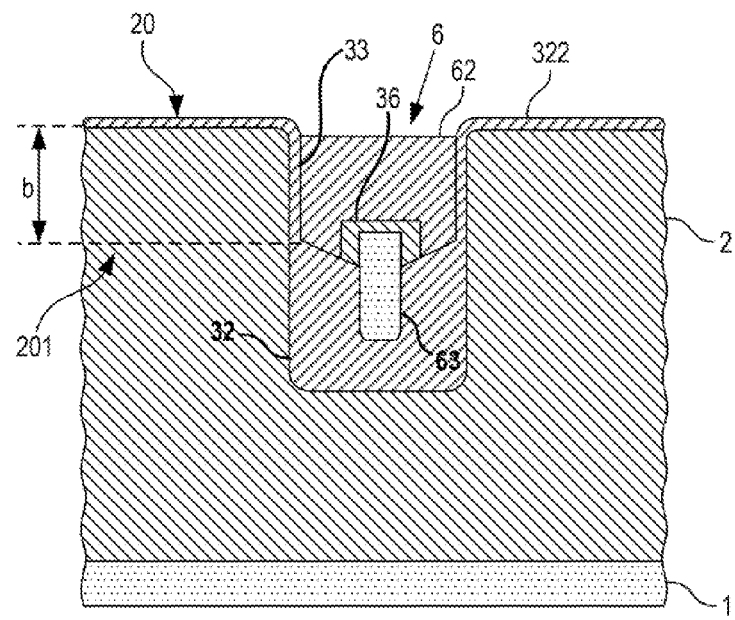
Figure 4:
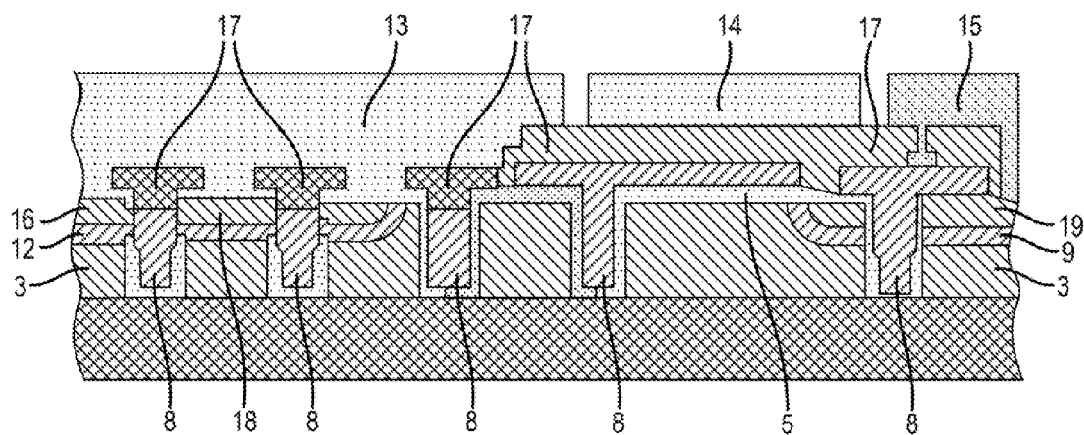
Figure 5:
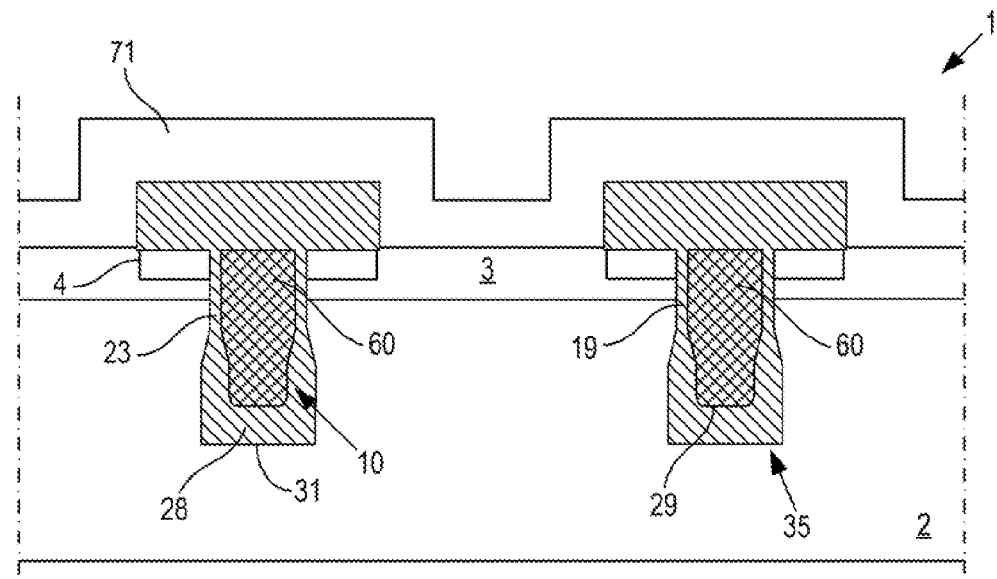
FIG. 5 shows, in a vertical section view, a portion of a power device with trench-gate structure realized according to an embodiment.
Figure 16:
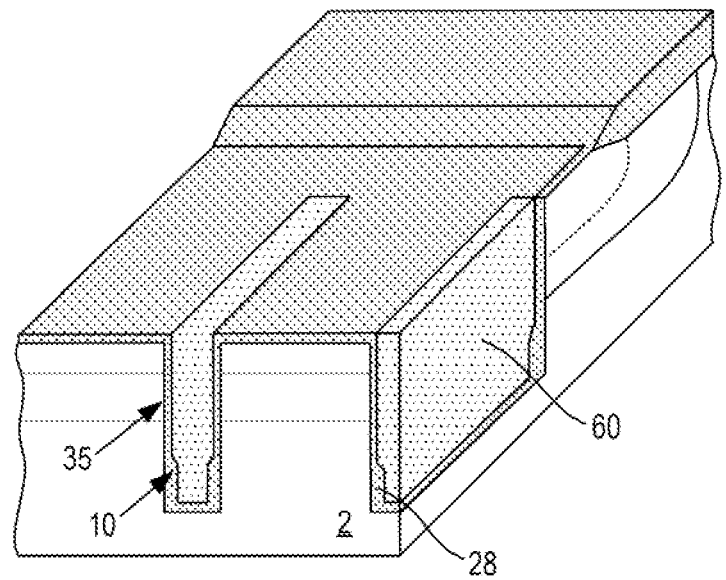
Figure 17:
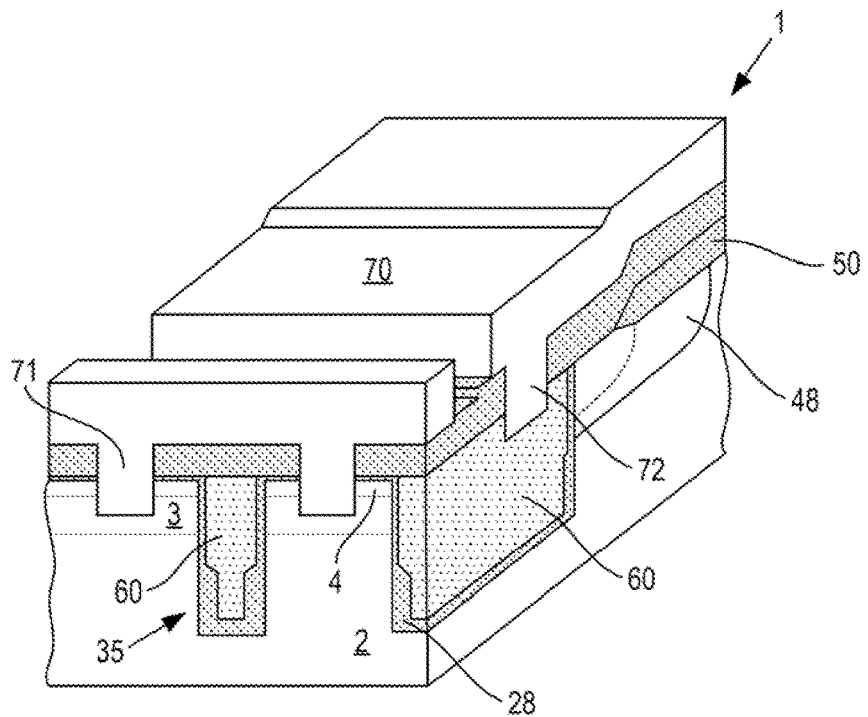
Figure 18:
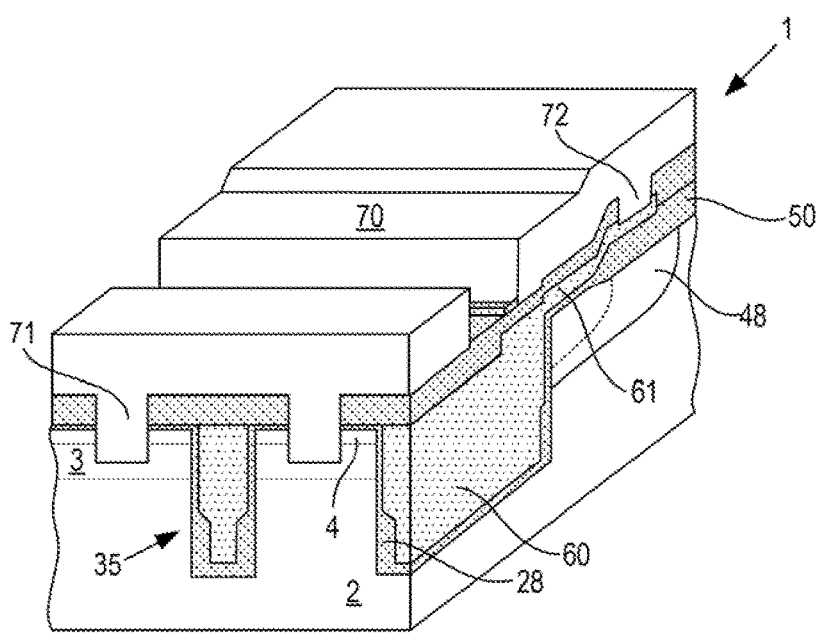

According to an embodiment, each first trench 19 and the corresponding second trench 29 define a trench-gate structure 10 as shown in FIG. 5 of the power device/suitable for containing a gate region 35, as indicated in FIGS. 16, 17 and 18.

Figure 11:
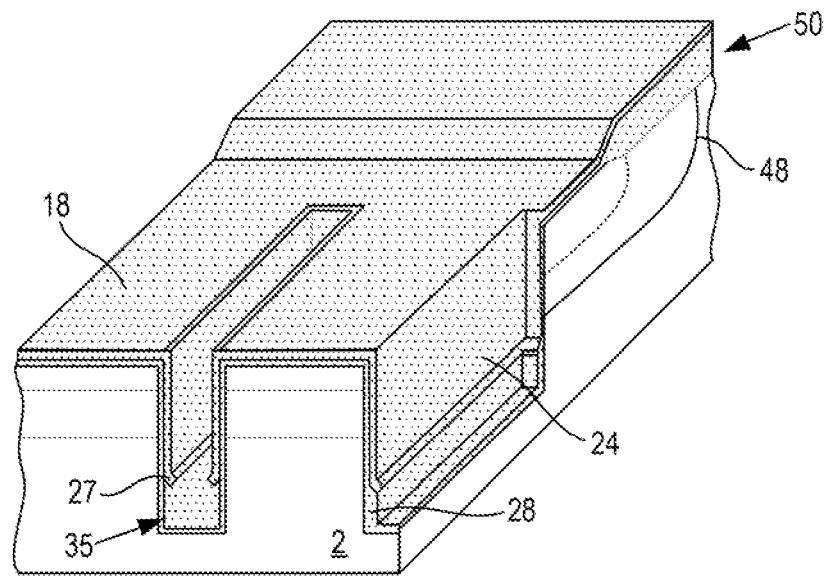
Figure 28:
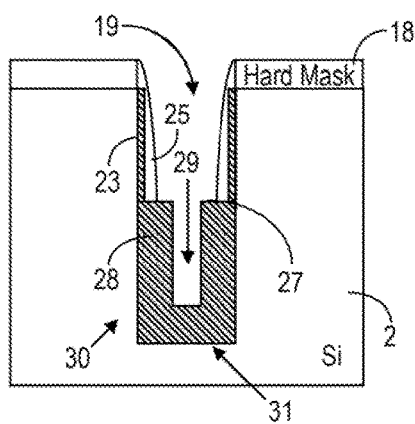

Subsequently, an embodiment provides, as shown in FIGS. 11 and 28:

forming, in each second trench 29, a first insulating coating layer 28 in correspondence with the second side walls 30 and with the bottom 31. This step may be realized by means of an oxidation step of the semiconductor substrate 2.

Thanks to the presence of the service spacers 25 and to the non oxidizing layer comprised in the hard mask 18, the oxidation step to form the first insulating coating layer 28 is selective and the oxide thus realized has a final thickness s1, which may be selectable, this thickness being chosen according to the application.

In particular the first insulating coating layer 28 may be formed by means of a localized oxidation process (LOCOS) along the second walls 30 and the bottom 31 of the second trench 29, the oxidation being inhibited by the service spacers 25 along the first walls 20 of the first trench 19 and of the hard mask 18 on the surface of the substrate 2.

In particular, as highlighted in FIG. 27, once the second trench 29 has been formed, the service layer 23 and the non-oxidizable layer 25 (spacer) remain on the vertical wall of the first trench 19 above the second one. The growth of the first coating layer 28, which is in particular a thick oxide layer, occurs in the cavity corresponding to this second trench 29, but also in correspondence with the substrate 2, and in particular with the portion thereof underlying the service spacer 25 as indicated in the dotted circle A in FIG. 27. Approximately 40% of the final thickness of an oxide (in particular of the first coating layer 28) is buried in the silicon. Therefore it is possible to balance the final thickness of this first coating layer 28 so that it is effectively self-aligned to that of the first trench 19, as it will be better described hereafter with reference to the FIG. 19.

As shown in FIGS. 11 and 28, during the oxidation step in the lower end of each service spacer 25, in correspondence with the remaining portions of the first bottom 21, the oxidation of the silicon portion left exposed in the cavity of the second trench 29 by the service non-oxidizable layer 24 which composes the service spacer 25 forms a typical "beak"-like shape 27.

Figure 12:
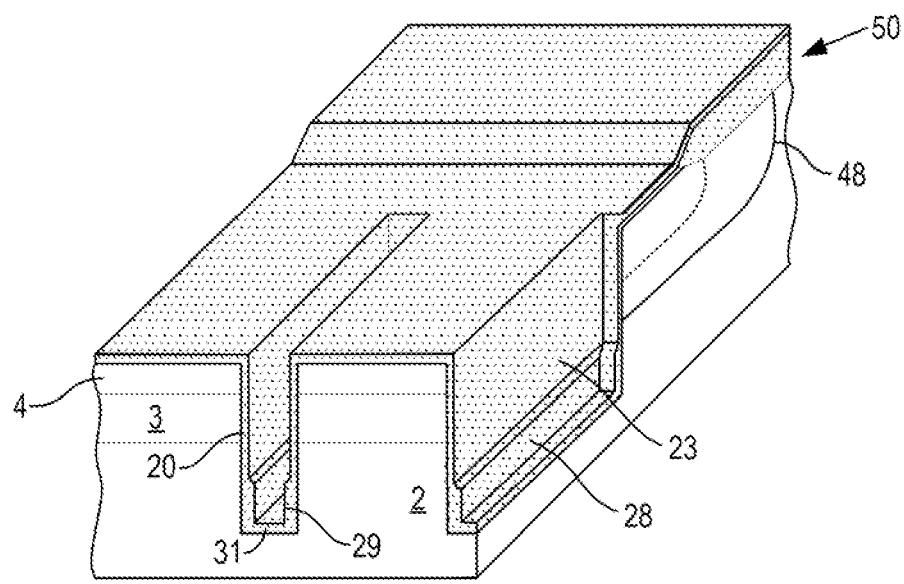
Figure 13:
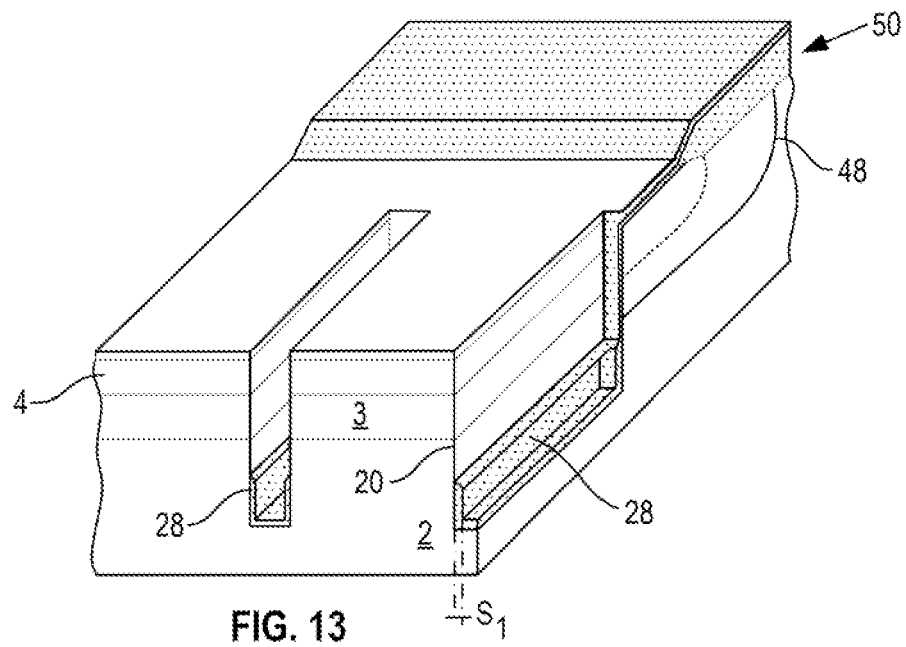
Figure 29:
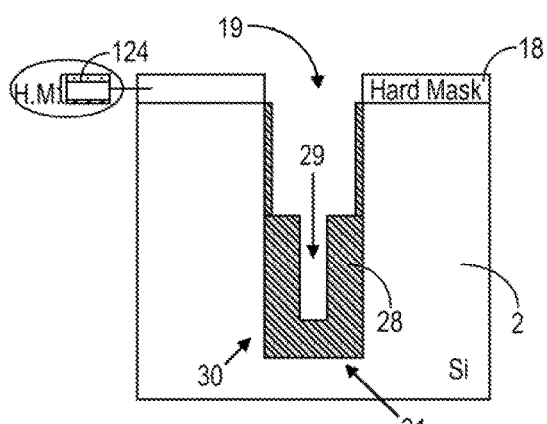
Figure 30:
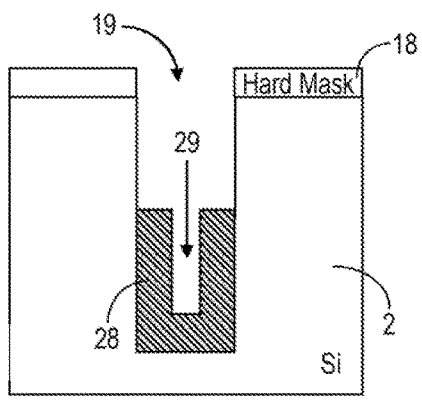
Figure 31:
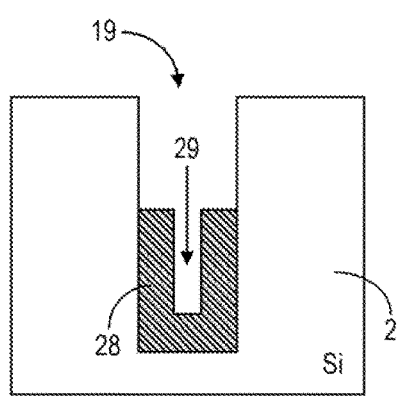

According to an embodiment provides:

a first step of removing the service spacers 25, i.e., the service non-oxidizable layer 24 as shown in FIGS. 11, 12 and 29, as well as a second step of removing the service insulating layer 23, as shown in FIGS. 13 and 30; and thus a step of cleaning the first side walls 20 and the upper surface of the semiconductor substrate 2, as shown in FIGS. 13 and 31, with removal of the hard mask 18 too. In particular, this step of cleaning the first side walls of the first trench 19 and removing the hard mask 18 may be carried out by means of a sequence of sacrificial oxidations followed by isotropic etchings.

Figure 14:
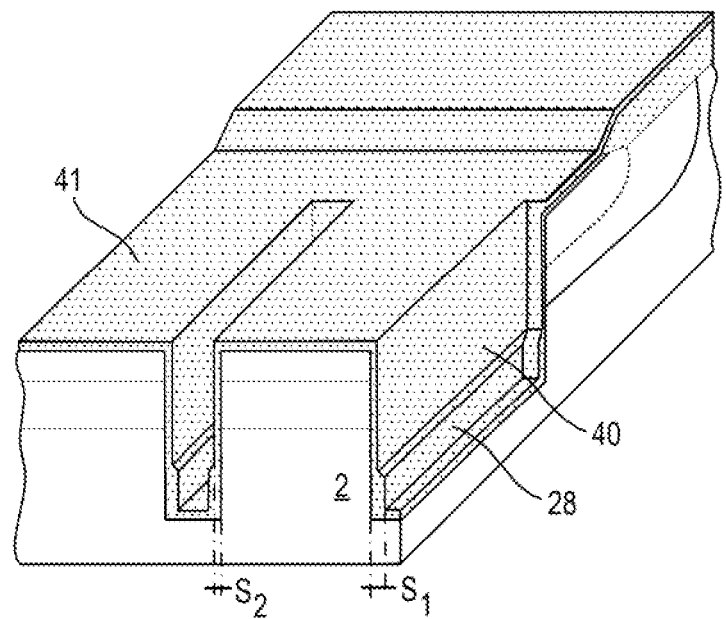
Figure 32:
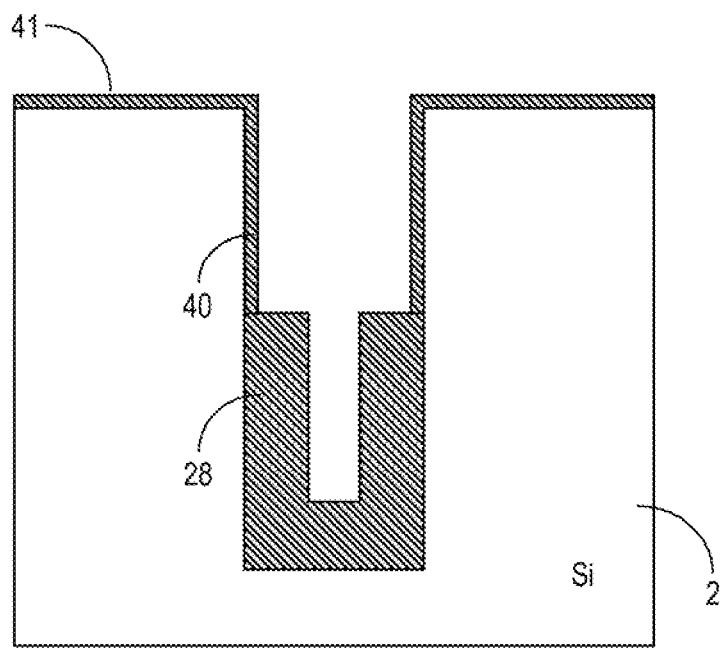

Subsequently, according to a further embodiment, a method provides:

realizing a second insulating coating layer 40 in correspondence with the first side walls 20 of each first trench 19 as well as a third insulating coating layer 41 above the semiconductor substrate 2, as shown in FIGS. 14 and 32. In particular, this step occurs, for example, by means of oxidation.

The second insulating coating layer 40 is continuous to the first inner insulating coating layer 28, realized in each second trench 29 and suitably has a thickness s2 reduced with respect to the thickness s1 of the first insulating coating layer 28. Moreover, according to a further embodiment, the third insulating coating layer 41 may be realized simultaneously with the second insulating coating layer 40 and with the same material.

Figure 15:
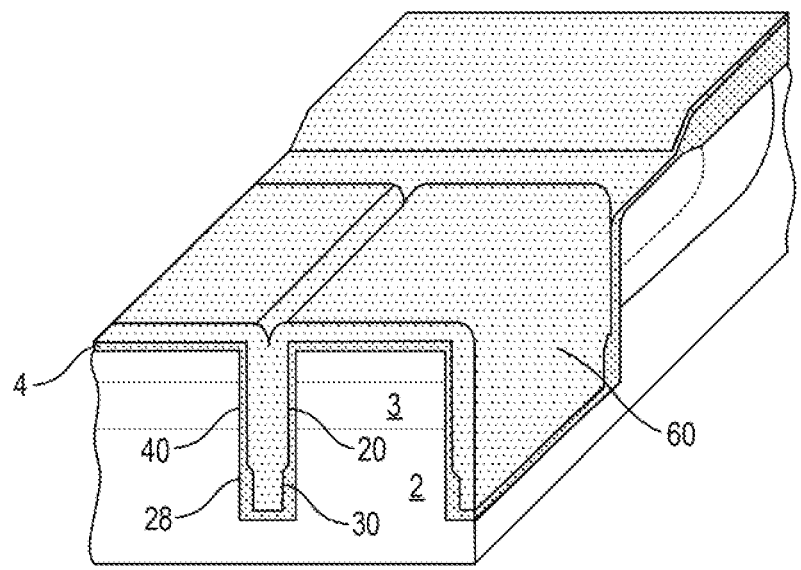
Figure 33:
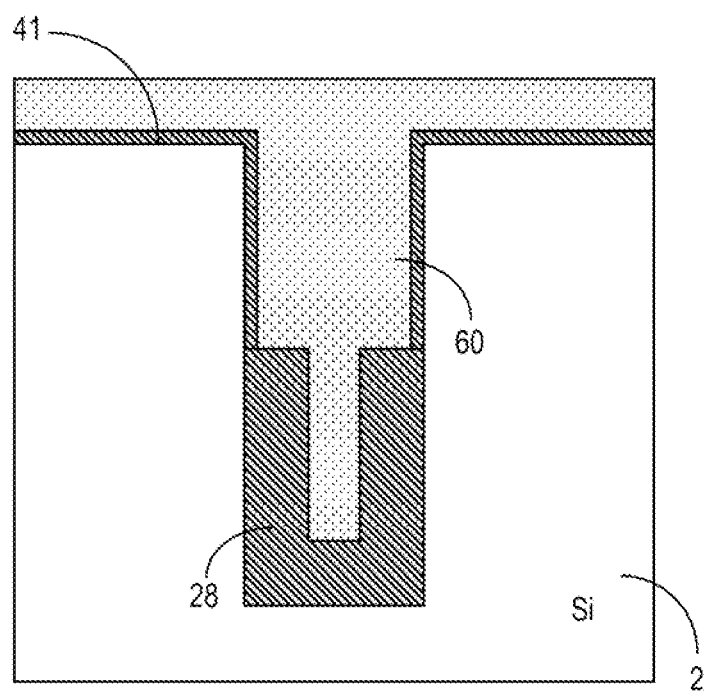

An embodiment provide:

deposition, by means of a CVD process, of a conductive layer 60, for example doped silicon, above the semiconductor substrate 2, as shown in FIGS. 15 and 33;

as well as:

definition of the conductive layer 60 in correspondence with the trench-gate structure 10 for the realization of the gate region 35.

According to an embodiment, the definition of the conductive layer 60 is such as to maintain this conductive layer 60 only inside each trench-gate structure 10, as shown in FIG. 16.

Finally, an embodiment provides, as shown in FIG. 17, the realization of metallic contacts, such as for example the gate 70 and source 71 ones, by means of a passivation and a metallization.

According to an embodiment, the gate contacts 70 are realized next to the circuit structure 50 by means of an appendix 72 suitable for contacting the conductive layer 60 inside each trench-gate structure 10.

According to a further embodiment, as shown in FIG. 18, the conductive layer 60 is defined by means of suitable and predetermined masks so as to comprise an extension 61 which overhangs at least one portion of the edge circuit structure 50.

In this case, then, the gate contacts 70 are realized above the edge circuit structure 50.

According to an embodiment, the second insulating coating layer 40, realized in the first side walls 20 of the first trench 19, defines the gate dielectric for the driving of the power device 1, while the insulating coating layer 28, in correspondence with the second trench 29, defines a thick insulating oxide layer between the gate region 35 and the underlying semiconductor substrate 2.

Figure 19:
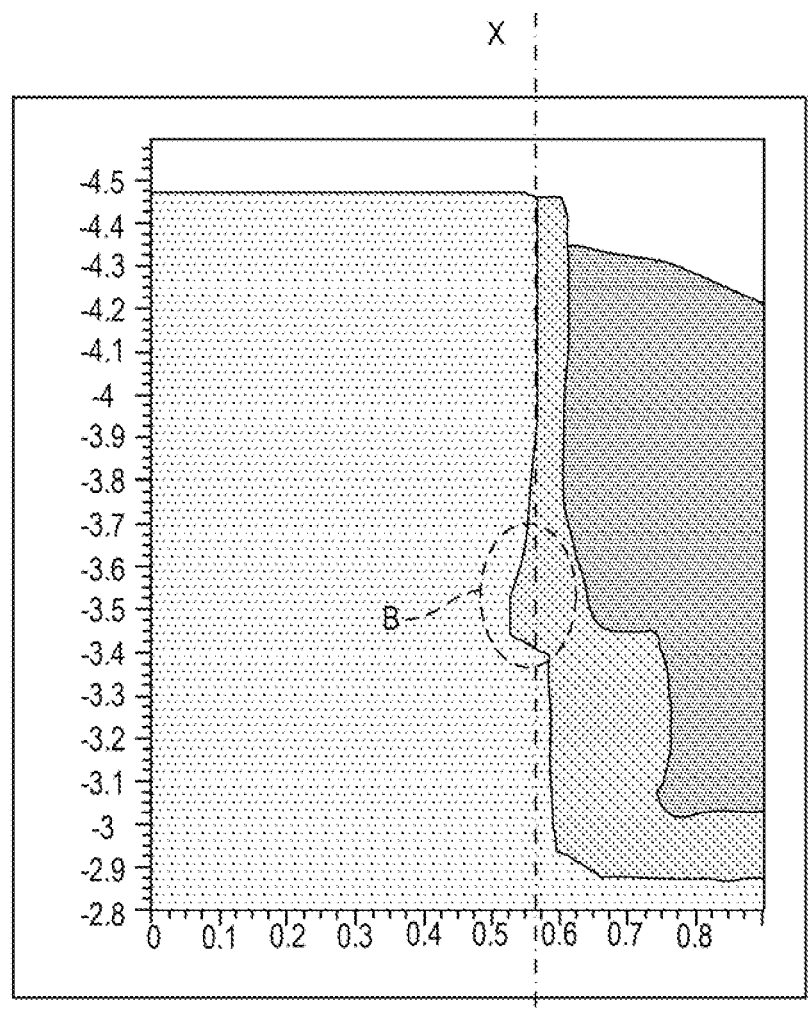
FIG. 19 shows a detail of the trench-gate structure in a simulation of a method in a working intermediate step, according to an embodiment.

According to a further embodiment and as shown in FIG. 19, which is an enlarged portion of a power device in correspondence with the trench-gate structure obtained by a simulation a trench-gate structure 10 comprises:

a transition lateral profile with a characteristic bird beak-like shape;

two different thicknesses of insulators at the walls, a thinner one in correspondence with the body layer 3 and a thicker one in correspondence with the bottom 31 of the trench-gate structure 10 able to bear intense electric fields;

a single inner conductive layer 60, e.g., a single poly of the gate region 35, making the conductivity characteristics of this region approximately constant.

In particular, a simulation has been carried out on a process realized so that the coating of the second trench 29 is as much as possible self-aligned with the first trench 19, as indicated by the line XX, a condition desired but not essential in an embodiment. Moreover, a simulation has highlighted the fact that, during the realization of the coating of the second trench 29, due to the diffusion of oxidizing agents in the silicon, the final structure may shows an oxide 'bump', indicated in the dotted circle B as remaining at the end of the process and a characteristic of a structure according to an embodiment.

Further, according to an embodiment, a method provides suitable metallization processes as well as the definition of the drain, source, and gate contacts for obtaining the power device 1.

According to an embodiment, a method allows an excellent definition of the service spacers 25. In particular, the limiter oxide layer 125 interposed is a limiter of the first etching sub-step of the service non-oxidizable layer 24 which allows to realize an excellent control of the height of the service spacers 25, in correspondence with the first side walls 20 of each first trench 19. This limiter oxide 125 also allows avoiding an excessive etching of the service non-oxidizable layer 24, which may lead to an excessive reduction of the height in correspondence with the first side walls 20 of each trench 19 with a possible successive malfunction of the power device 1.

Figure 34:
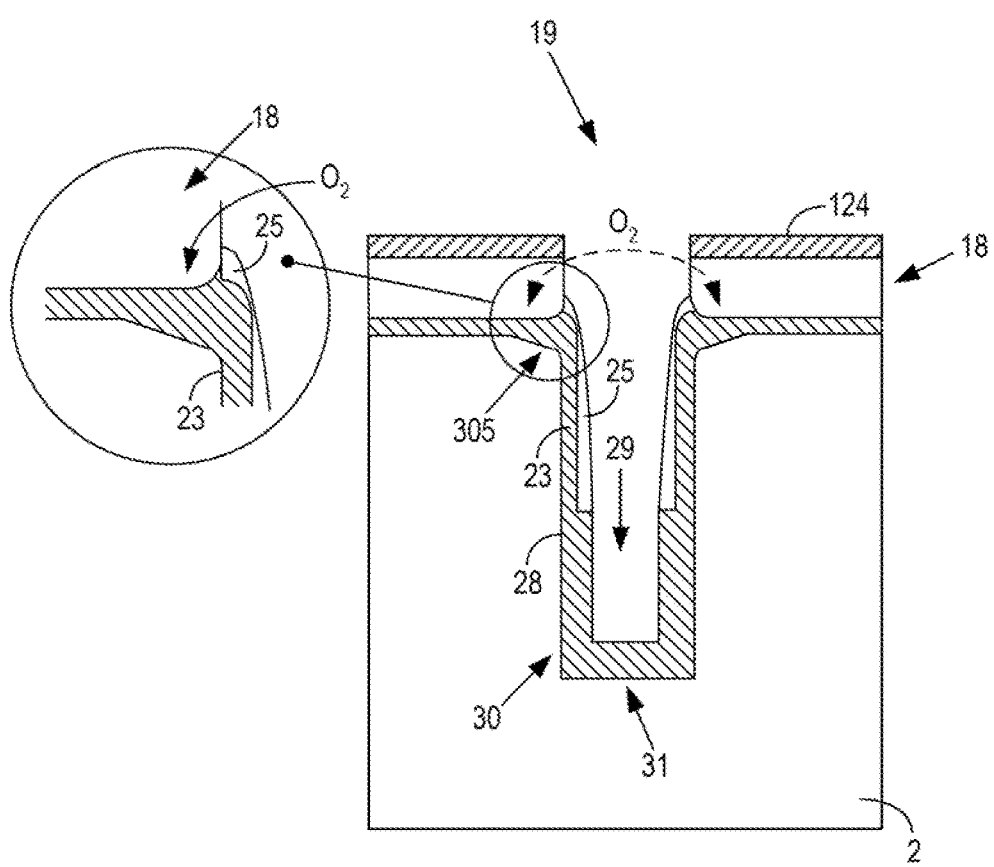
FIG. 34 shows an example of a bird beak being formed between the hard mask and substrate due to diffusion of an oxidant species through the hard mask.

As shown in FIG. 34 excessive reduction of the height of the spacer 25 may impact structure formation. For example, if the spacer 25 is below the selectively-oxidizable layer 124 of the hard mask 18 during oxidation, a bird beak 305 is also formed between the hard mask 18 and the substrate 2 due to diffusion of the oxidant species through the hard mask 18. Accordingly, in various embodiments, it may be desirable for the spacer 25 to extend at least to the selectively-oxidizable layer 124 of the hard mask 18.

Figure 35A:
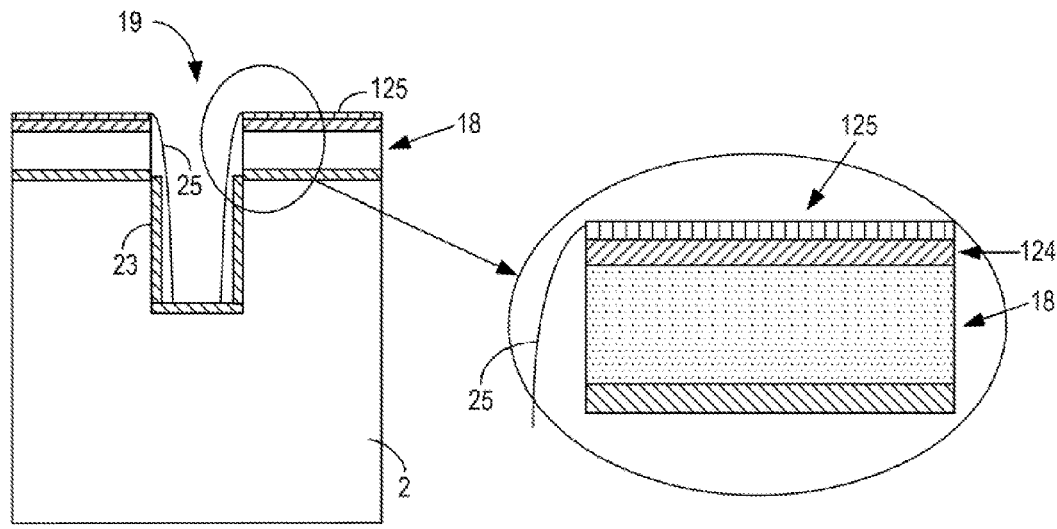
FIGS. 35a and 35b show a spacer extending to a limiting layer used as an end-point during etching of the spacer.
Figure 35B:
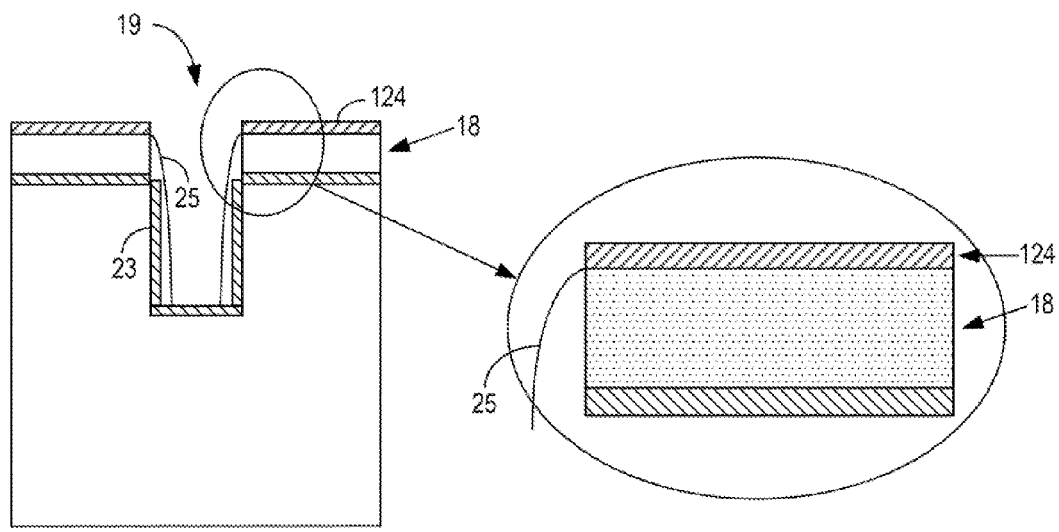

In an embodiment, as shown in FIG. 35a, the spacer 25 may extend to a limiting layer 125 that may serve as an end-point during etching of the spacer 25, which leaves the spacer 25 extending at least to the selectively-oxidizable layer 124 at the termination of etching of the spacer 25. For example, FIG. 35a depicts the spacer 25, hard mask 18, and limiting layer 125 during the spacer etching and after removal of the non-oxidable layer 126, and FIG. 35b depicts the spacer 25 and hard mask 18 after etching is completed, where the spacer 25 extends at least to the selectively-oxidizable layer 124. The etching process may be calibrated to facilitate suitable etching of the spacer 25 so as to achieve this result.

The thickness of the oxide layer 125 interposed within the thickness of the service insulating layer 23 may be suitably realized through oxidation of the final hard mask-selectively oxidizable layer 124, in particular of nitride.

Although the selectively-oxidizable layer 124 is typically not oxidizable under most conditions, it may be oxidizable at high temperatures. (Sam Zhang, Nasar Ali "Nanocomposite thin films and coatings: processing, properties and performance" Imperial college Press, 2007, pg. 98, which is incorporated by reference). For example, the selectively-oxidizable layer 124 of the hard mask 18 may be silicon nitride ($Si_3N_4$), which may be oxidized via the following reaction under certain conditions.

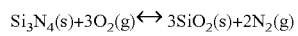

$Si_3N_4(s) + 3O_2(g) \leftrightarrow 3SiO_2(s) + 2N_2(g)$

For example, oxidation may be the result of inward diffusion of oxygen into the $Si_3N_4$ layer. Under certain conditions, oxidation of the silicon nitride to stoichiometric $SiO_2$ starts at approximately 400° C., which may result in a low yield of nitrogen oxide. However, in an embodiment, the yield of nitrogen oxide may be inconsequential because of a desired nitrogen oxide thickness of approximately 0.5-10 nm, which may be used as a stop layer.

In an embodiment, the oxidation of the selectively-oxidizable layer 124 achieved by an In-Situ Steam Generation (ISSG) process at approximately 1200° C. (Dinesh C. Gupta, George A. Brown Editors "Gate dielectric integrity: material, process, and tool qualification, "American Society for Testing and Materials, 2000, Volume 1, Issue 1382, pg. 124, which is incorporated by reference). For example, the ISSG is a low pressure process where $O_2$ and $H_2$ gases are introduced to the process chamber without precombustion.

Figure 36A:
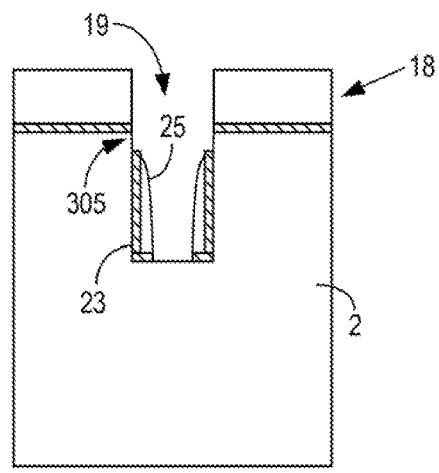
FIGS. 36a, 36b and 36c show how thick oxide portions are generated in the source region where a spacer fails to cover a portion of the silicon substrate below a hard mask.
Figure 36B:
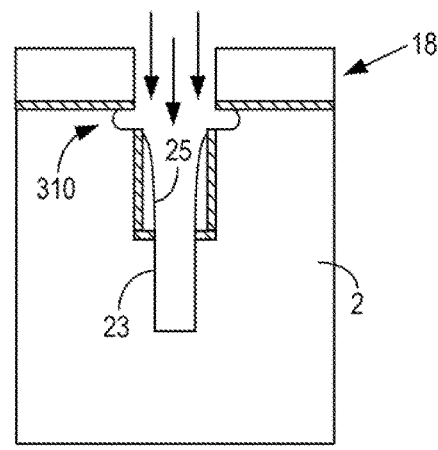
Figure 36C:
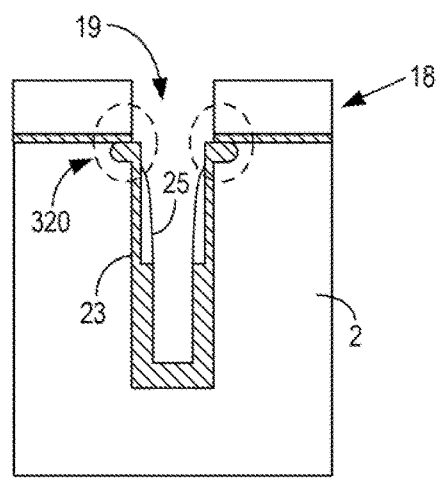

In an embodiment, it may be desirable to have the limiting layer 125 and the spacer 25 extending approximately to the limiting layer to prevent unwanted feature formation during an etching and oxidation process. For example, FIGS. 36a, 36b and 36c depict how undesirable thick oxide portions 320 may be generated in the source region where the spacer 25 fails to cover a portion 305 of the silicon substrate 2 below the hard mask 18. The oxide portions 320 may negatively affect the shape or doping of the source region.

FIG. 36a depicts the spacer 25 only covering a portion of the insulating layer 23 and leaving a portion of the silicon substrate 2 exposed below the hard mask 18.

FIG. 36b depicts a cavity 310 that is formed during the etching process in the exposed portion 305 of the silicon substrate 2.

FIG. 36c depicts thick oxide portions 320 that are formed in the cavity 310 during the oxidation process.

An embodiment also relates to a power device with trench-gate structure of the MIS type, obtained by an embodiment of a method as previously described for which details and cooperating parts having the same structure and function will be indicated with the same numbers and references.

FIG. 5 shows a cross section of an embodiment of a power device/with trench-gate structure 10, integrated on a semiconductor substrate 2.

Figure 6:
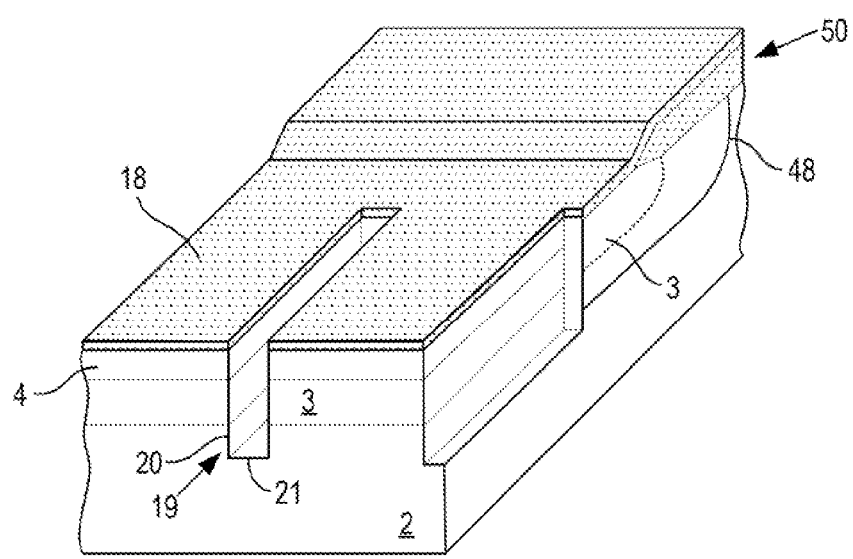
FIGS. 6 to 18 show, in a partially section perspective view, a portion of the power device of FIG. 5 wherein also the edge circuit structure can be seen in some steps of a method according to an embodiment.

The final structure of the power device 1, naturally, may comprise an edge circuit structure 50, with a ring 48, as shown in FIG. 6, and also a body layer 3 and source regions 4 laterally located to each trench-gate structure 10.

According to an embodiment, the trench-gate structure 10 comprises a plurality of first trenches 19 made in the semiconductor substrate 2, each first trench 19 having first side walls 20, as shown in FIG. 6.

The trench-gate structure 10 also comprises a plurality of second trenches 29, as shown in FIG. 10, each realized inside the first trench 19 and below it, contained and approximately self-aligned to the geometries of the corresponding first trench 19. The second trench 29 has second side walls 30 and a bottom 31.

The second side walls 30 and the first side walls 20 may define a bird beak-like transition profile of the trench-gate structure 10, as highlighted in particular in FIG. 19.

The trench-gate structure 10 also comprises a first inner insulating coating layer 28 in each second trench 29, in correspondence with the second side walls 30 and with the bottom 31.

The first insulating coating layer 28, of suitable thickness s1, is connected to a second insulating coating layer 40, as shown in FIG. 14, present in correspondence with the first side walls 20, which has a thickness s2. The thickness s1 of the first insulating coating layer 28 is greater than the thickness s2 of the second insulating coating layer 40.

In particular, the first 28 and the second insulating coating layer 40 may define a bird-beak-like transition.

The trench-gate structure 10 comprises inside a conductive layer 60, for example of doped polysilicon, for the realization of a gate region 35, as shown in FIG. 16.

The final structure of an embodiment of the power device/ thus comprises metallic contacts, such as for example the gate 70 and source 71 contacts, as well as, in a known way, usual metallizations for completing the structure of the power device 1.

According to an embodiment, as shown in FIG. 17, the gate contacts 70 are realized next to the circuit structure 50 with an appendix or extension 72 suitable for contacting the conductive layer 60 inside each trench-gate structure 10.

According to a further embodiment, as shown in FIG. 18, the conductive layer 60 has an extension 61, which overhangs at least one portion of the edge circuit structure 50 and which is suitably contacted by the gate contacts 70, which are thus realized above a ring 48.

In conclusion, embodiments of a method and a device solve a technical problem and allow one to obtain a power semiconductor device with trench-gate structure provided with a bird beak-like profile comprising first and second side walls which have corresponding and differentiated insulating coatings.

The first insulating coating layer which defines the thick oxide may be obtained in a self alignment method and without the use of service layers which may compromise the "strength" of the oxide. The device thus may have a thicker and "stronger" insulating coating in correspondence with the limited bottom of the trench-gate structure, and with the second side walls, while it has a reduced thickness in correspondence with the first side walls, which allow to improve or optimize the performance characteristics with respect to conventional devices.

According to an embodiment, there is an improvement of the conductivity of the gate region obtained thanks to the presence of a single conductive layer inside the trench-gate structure which allows uniformity and which improves its performance.

Further, the presence of the first insulating coating layer 28 in the second trench 29 may reduce the gate charge of the device as a whole.

The power device 1 may be part of a system such as a automobile, and may be coupled to an integrated circuit such as a controller, and may be disposed on the same or different die as the integrated circuit. For example, the controller may be disposed in the edge region 50 of the power device. Modifications and variations to the disclosure may be made so as to meet incidental and specific needs, all within the spirit and scope of the disclosure.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. A power device, comprising:
   a semiconductor substrate;
   a trench extending in to the semiconductor substrate in a first direction, the trench including:
   an upper trench portion in the semiconductor substrate, the upper trench portion having first side walls spaced apart from each other in a second direction by a first trench width, the second direction being orthogonal to the first direction;
   a lower trench portion in the semiconductor substrate, the lower trench portion having second side walls spaced apart from each other in the second direction by a second trench width that is smaller than the first trench width;
   a transitional trench portion that spaces the upper trench portion from the lower trench portion in the first direction, the transitional trench portion having third sidewalls spaced apart from each other in the second direction by a third trench width that is larger than the first trench width; and
   a bottom trench surface in the semiconductor substrate, the bottom trench surface being orthogonal to the second side walls of the lower trench portion, the first side walls, the second sidewalls, and the third sidewalls, and the bottom trench being surfaces of the semiconductor substrate; and
   a gate conductor extending in to the trench in the first direction, the gate conductor including:
   an upper gate portion positioned within the upper trench portion and aligned with the first sidewalls, the upper gate portion having outer surfaces spaced apart from each other in the second direction by a first gate width;
   a lower gate portion positioned within the lower trench portion and aligned with the second sidewalls, the bottom gate portion having outer surfaces spaced apart from each other in the second direction by a second gate width that is smaller than the first gate width;
   a curved transition that spaces the upper gate portion from the lower gate portion in the first direction; and
   a bottom gate surface positioned within the lower trench portion, the bottom gate surface being parallel to the bottom trench surface.

2. The device according to claim 1, further comprising a first insulating coating layer coating the second side walls of the lower trench portion and the bottom trench surface.

3. The device according to claim 2, further comprising a second insulating coating layer coating the first side walls of the upper trench portion, the second insulating coating layer being continuous to the first insulating coating layer and having a reduced thickness with respect to a thickness of the first insulating coating layer.

4. The device according to claim 3, further comprising:
   a third insulating coating layer above the semiconductor substrate; and
   a conductive layer extending on the third insulating coating layer and above the semiconductor substrate, the conductive layer being continuous with said gate conductor.

5. The device according to claim 1, wherein the third sidewalls transition from the first sidewalls to the second sidewalls with a curved profile.

6. The device according to claim 1 wherein the transitional trench portion of the trench is aligned with and positioned lateral to the curved transition of the gate conductor.

7. A device comprising:
   a semiconductor layer;
   a trench extending in to the semiconductor layer in a first direction, the trench including:

a first portion having first sidewalls that are spaced from each other in a second direction by a first width, the second direction being orthogonal to the first direction;
a second portion that is spaced from the semiconductor layer in the first direction by the first portion, the second portion having second sidewalls that are spaced from each other in the second direction by a second width that is greater than the first width;
a third portion that spaces the first portion from the second portion in the first direction, the third portion having third sidewalls that are spaced from each other in the second direction by a width that transitions from the first width to a third width and from the third width to the second width, the third width being greater than the second width, the first sidewalls, the second sidewalls, and the third sidewalls being surfaces of the semiconductor layer; and
a gate conductor extending into the trench in the first direction, the gate conductor including:
first outer surfaces that face the first sidewalls, the first outer surfaces being spaced from each other in the second direction by a first gate width; and
second outer surfaces that face the second sidewalls, the second outer surfaces being spaced from each other in the second direction by a second gate width that is greater than the first gate width.

8. The device of claim 7, further comprising:
a gate insulator on the first, second, and third sidewalls and a bottom surface of the trench, the gate conductor being spaced from the semiconductor layer by the gate insulator.

9. The device of claim 7 wherein the semiconductor layer includes silicon.

10. The device of claim 7, further comprising:
a gate insulator disposed on the first, second, and third sidewalls, the gate insulator including:
a first portion disposed on the first sidewalls, the first portion of the gate insulator having a first thickness; and
a second portion disposed on the second sidewalls, the second portion of the gate insulator having a second thickness that is different than the first thickness.

11. The device of claim 7, further comprising a gate insulator disposed on the first, second, and third sidewalls and a bottom trench surface of the trench, the third portion of the trench including a cavity that extends in to the semiconductor layer.

12. The device of claim 7, further comprising a gate insulator disposed on the first, second, and third sidewalls and a bottom trench surface of the trench, the third portion of the trench including an outward protrusion.

13. The device of claim 7, further comprising:
a gate insulator disposed on the first, second, and third sidewalls and a bottom surface of the trench, the gate insulator including:
a first portion disposed on the first sidewalls, the first portion of the gate insulator having a first thickness; and
a second portion disposed on the second sidewalls, the second portion of the gate insulator having a second thickness that is less than the first thickness.

14. The device of claim 7, further comprising:
a gate insulator disposed on the first, second, and third sidewalls and a bottom surface of the trench, the gate insulator including:
a first portion disposed on the first sidewalls, the first portion of the gate insulator having a first thickness;
a second portion disposed on the second sidewalls, the second portion of the trench, the second portion of the gate insulator having a second thickness that is less than the first thickness; and
a third portion disposed on the bottom surface of the trench, the third portion of the gate insulator having a third thickness that is approximately the same as the second thickness.

15. A device comprising:
a semiconductor layer;
a trench extending in to the semiconductor layer in a first direction, the trench including:
a first sidewall having a first upper surface, a first lower surface, and a first bump that protrudes into the semiconductor layer, the first bump spacing the first upper surface from the first lower surface in the first direction;
a second sidewall having a second upper surface, a second lower surface, and a second bump that protrudes into the semiconductor layer, the second bump spacing the second upper surface from the second lower surface in the first direction, the first upper surface being spaced from the second upper surface in a second direction by a first distance, the first lower surface being spaced from the second lower surface in the second direction by a second distance that is less than the first distance, the first bump being spaced from the second bump in the second direction by a third distance that is larger than the first distance, the second direction being orthogonal to the first direction, the first upper surface, the first lower surface, the second upper surface, and the second lower surface being surfaces of the semiconductor layer; and
a bottom trench surface that is orthogonal to the first and second sidewalls; and
a gate conductor extending in to the trench in the first direction, the gate including:
first gate surfaces aligned with the first upper surface and the second upper surface, the first gate surfaces being spaced from each other in the second direction by a first gate width; and
second gate surfaces aligned with the first lower surface and the second lower surface, the second gate surfaces being spaced from each other in the second direction by a second gate width that is smaller than the first gate width.

16. The device of claim 15 wherein the first lower surface of the first sidewall protrudes inward relative to the first upper surface of the first sidewall.

17. The device of claim 15 wherein the first cavity, the second cavity, and the curved transition are aligned with each other.

18. A device comprising:
a semiconductor layer;
a trench extending in to the semiconductor layer in a first direction, the trench including:
sidewalls that extend in a second direction that is orthogonal to the first direction the sidewalls having a first portion in which the sidewalls are spaced from each other in the second direction by a first width, a second portion in which the sidewalls are spaced from each other in the second direction by a second width, and a third portion in which the sidewalls are spaced from each other in the second direction by a third width, the third portion spacing the first portion from the second portion in the first direction, the second width being greater than the first width, the third width being greater than the second width, the sidewalls being surfaces of the semiconductor layer; and a bottom trench surface that is orthogonal to the sidewalls, the first portion of the sidewalls being spaced from the bottom trench surface in the first direction by the second portion of the sidewalls;

a gate insulator having a first portion of a first thickness on the first portion of the sidewalls, a second portion of a second thickness on the second portion of the sidewalls, and having a third portion of a third thickness on the third portion of the gate insulator; and a gate conductor having an upper gate surface and a bottom gate surface, the gate conductor positioned in the trench, the gate conductor being spaced from the semiconductor layer by the gate insulator, the upper gate surface having a width greater than a width of the bottom gate surface, the bottom gate surface being parallel to the bottom trench surface.

19. The device of claim 18 wherein the first thickness is greater than the second thickness.

20. The device of claim 18 wherein the gate insulator protrudes outwardly near a junction of the first and second portions of the gate insulator.

21. The device of claim 18 wherein said gate insulator comprises a fourth portion of a fourth thickness disposed over the bottom trench surface of the trench, the fourth thickness being approximately the same as the first thickness.

22. The device of claim 18 wherein the third thickness is greater than the second thickness.

23. A transistor comprising:
a semiconductor layer having a surface;
a trench in the semiconductor layer, the trench having sidewalls and a bottom trench surface, the trench having a first portion of a first width, a second portion of a second width, the second width being less than the first width, the bottom trench surface being orthogonal to the sidewalls, the second portion being spaced from the bottom trench surface by the first portion;
at least one gate insulator on the sidewalls and the bottom trench surface of the trench;
at least one gate conductor having an upper gate surface and a bottom gate surface in the trench, the at least one gate conductor having a curved transition between the upper and bottom gate surfaces; the upper gate surface of the at least one gate conductor having a width greater than a width of the bottom gate surface, the bottom gate surface being parallel to the bottom trench surface;
a first source region and a second source region adjacent to the surface of the semiconductor layer, the first source region positioned on a first side of the trench, the second source region positioned on a second side, opposite to the first side, of the trench;
a source contact on the semiconductor layer, the source contact extending from the first source region, across the trench, and to the second source region, the source contact including a first portion directly overlying the first source region, a middle portion directly overlying the trench, and a second portion directly overt ring the second source region;
at least one body region on the semiconductor layer adjacent to at least one of the sidewalls of the trench; and
at least one drain on the semiconductor layer.

24. The transistor of claim 23 wherein the source contact extends through the first source region and into the at least one body region.

25. An integrated circuit comprising:
a transistor including:
a semiconductor layer having a surface,
at least one trench in the semiconductor layer, the trench having sidewalls and a bottom trench surface, the trench having a first portion of a first width and a second portion of a second width, the second width being less than the first width, the bottom trench surface being orthogonal to the sidewalls, the second portion being spaced from the bottom trench surface by the first portion;
at least one gate insulator on the sidewalls and the bottom trench surface of said at least one trench,
at least one gate conductor having an upper gate surface and a bottom gate surface in the at least one trench, the at least one gate conductor having a curved transition between the upper and bottom gate surfaces, the upper gate surface of the at least one gate conductor having a width greater than a width of the bottom gate surface, the bottom gate surface being parallel to the bottom trench surface;
at least one source region adjacent to the surface of the semiconductor layer and to the at least one trench, a first source region of the at least one source region positioned on a first side of a first trench of the at least one trench, a second source region of the at least one source region positioned on a second side of the first trench;
a source contact that overlaps and directly overlies the first source region, the second source region, and the first trench;
at least one body region on the semiconductor layer adjacent to at least one of the sidewalls of the trench, and
at least one drain in the semiconductor layer; and
circuitry coupled to the transistor.

26. The integrated circuit of claim 25, further comprising a die, the transistor being disposed on an inner region of the die, the circuitry being disposed on an outer region of the die.

27. A system comprising:
a first integrated circuit comprising:
a semiconductor layer;
a trench in the semiconductor layer, the trench having sidewalls and a bottom trench surface, the trench having a first portion of a first width and a second portion of a second width, the second width being less than the first width, the bottom trench surface being orthogonal to the sidewalls, the second portion being spaced from the bottom trench surface by the first portion;
a gate insulator on the sidewalls and the bottom trench surface of the trench;
a gate conductor having an upper gate surface and a bottom gate surface in the trench, the gate conductor having a curved transition between the upper and bottom gate surfaces, the upper gate surface of the gate conductor having a width greater than a width of the bottom gate surface, the bottom gate surface being parallel to the bottom trench surface;
a first source region and a second source region adjacent to the surface of said semiconductor layer, the first source region positioned on a first side of the trench, the second source region positioned on a second side of the trench;

a source contact extending from the first source region, across the trench, and to the second source region, the source contact including a first portion directly overlying the first source region, a middle portion directly overlying the trench, and a second portion directly overlying the second source region;

a body region on the semiconductor layer adjacent to the sidewalls of the trench; and a drain in the semiconductor layer; and a second integrated circuit coupled to the first integrated circuit.

28. The system of claim 27 wherein the first and second integrated circuits are disposed on different dies.

29. The system of claim 27 wherein the first and second integrated circuits are disposed on a same die.

30. The system of claim 27 wherein the second integrated circuit includes a controller.

* * * * *

UNITED STATES PATENT AND TRADEMARK OFFICE
CERTIFICATE OF CORRECTION

PATENT NO. : 9,972,496 B2
APPLICATION NO. : 12/724342
DATED : May 15, 2018
INVENTOR(S) : Giacomo Barletta It is certified that error appears in the above-identified patent and that said Letters Patent is hereby corrected as shown below:

In the Claims

Column 14, Lines 3-5:
"a second portion disposed on the second sidewalls, the second portion of the trench, the second portion of the gate insulator having a second thickness" should read, --a second portion disposed on the second sidewalls, the second portion of the gate insulator having a second thickness--.

Column 15, Line 62:
"second portion directly overt ring" should read, --second portion directly overlying--.

Signed and Sealed this
Nineteenth Day of February, 2019

Andrei Iancu
*Director of the United States Patent and Trademark Office*